United States Patent [19]
Aylor et al.

[11] Patent Number: 5,808,445
[45] Date of Patent: Sep. 15, 1998

[54] METHOD FOR MONITORING REMAINING BATTERY CAPACITY

[75] Inventors: James H. Aylor, Charlottesville; Mark A. Lepsch, Sterling, both of Va.

[73] Assignee: The University of Virginia Patent Foundation, Charlottesville, Va.

[21] Appl. No.: 760,956

[22] Filed: Dec. 6, 1996

Related U.S. Application Data

[63] Continuation-in-part of Ser. No. 8,246, Dec. 6, 1995.

[51] Int. Cl.$^6$ .................................................. H01M 10/48
[52] U.S. Cl. .................................. 320/132; 320/DIG. 21
[58] Field of Search .................................. 320/5, 29, 30, 320/34, 43, 44, 48, 132, DIG. 21; 324/427, 432, 433; 340/636; 429/90

[56] References Cited

U.S. PATENT DOCUMENTS

| | | | |
|---|---|---|---|
| 4,021,718 | 5/1977 | Konrad | 320/48 |
| 4,180,770 | 12/1979 | Eby | 320/48 X |
| 4,460,870 | 7/1984 | Finger | 320/48 X |
| 4,677,363 | 6/1987 | Kopmann | 320/44 |
| 4,876,513 | 10/1989 | Brilmyer et al. | 320/48 X |
| 5,160,880 | 11/1992 | Palanisamy | 320/39 X |

*Primary Examiner*—Edward Tso
*Attorney, Agent, or Firm*—Sheldon H. Parker

[57] ABSTRACT

A complete energy management system for lead-acid batteries. The system is designed for deep discharge batteries in traction vehicle type applications such as electric wheelchairs, electric vehicles, golf carts, or industrial equipment, where more efficient use of lead-acid batteries during both the charging and discharging cycle is needed. This system utilizes current measurements, open circuit voltage measurements during the recovery from charging or discharging, and an adaptation calculation to account for variations in physical battery characteristics, battery treatment, battery environment, and battery aging.

23 Claims, 4 Drawing Sheets

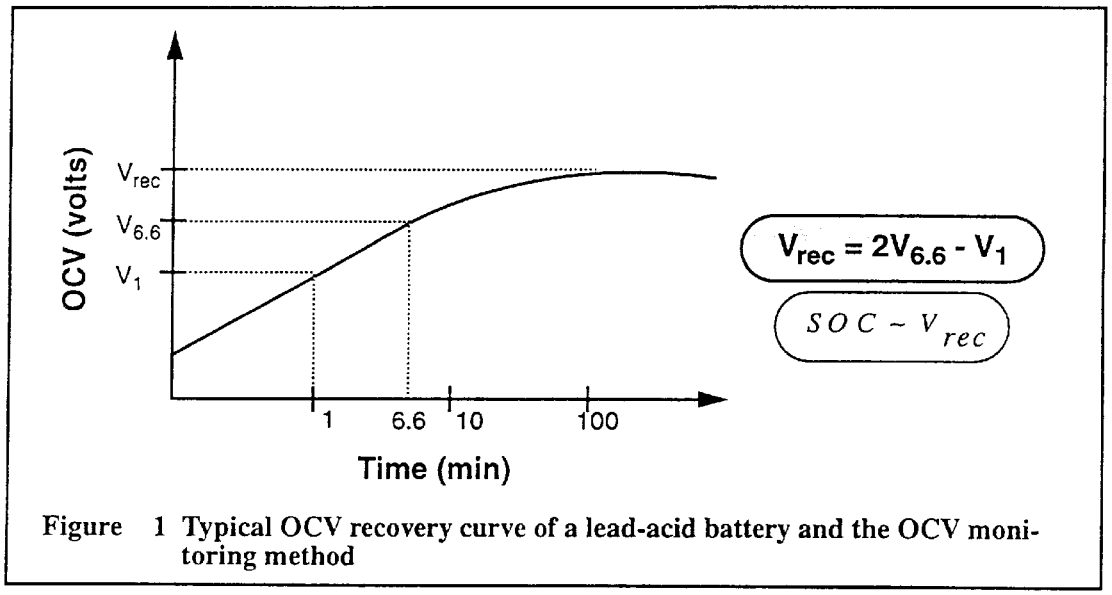
Figure 1  Typical OCV recovery curve of a lead-acid battery and the OCV monitoring method
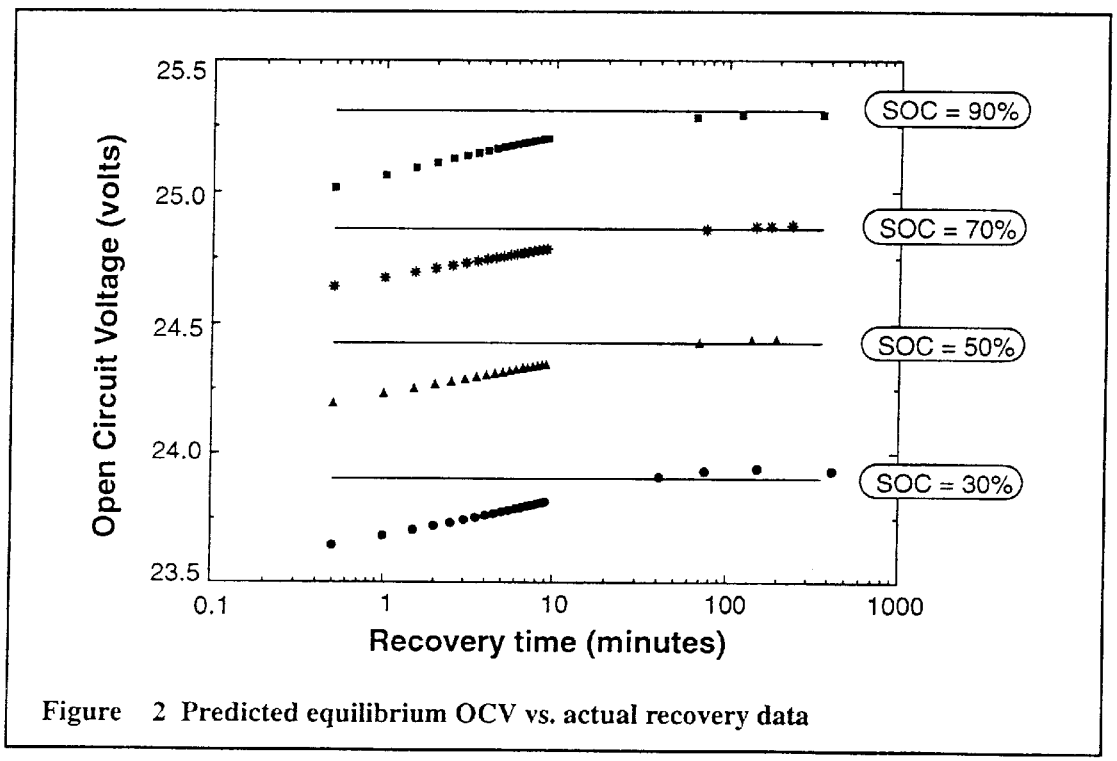
Figure 2  Predicted equilibrium OCV vs. actual recovery data

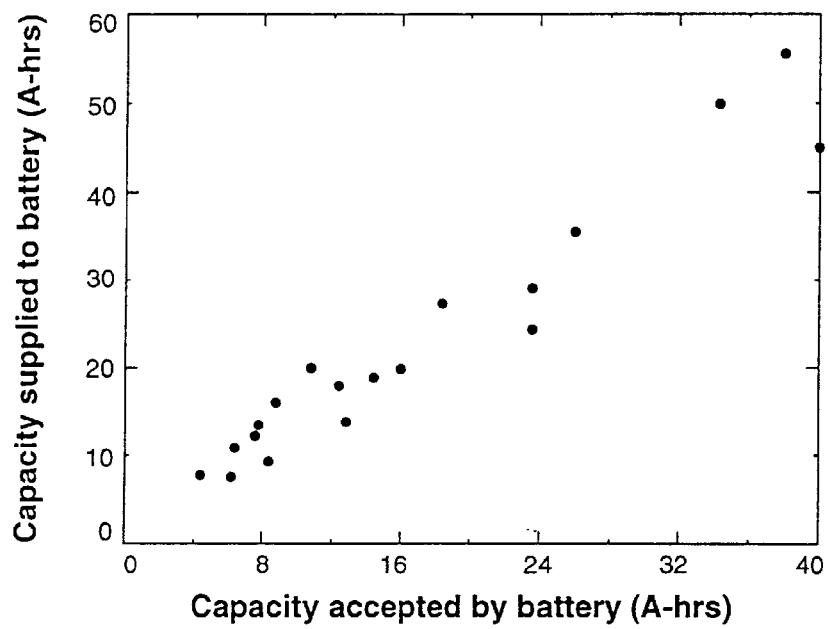
Figure 3   Charging efficiency
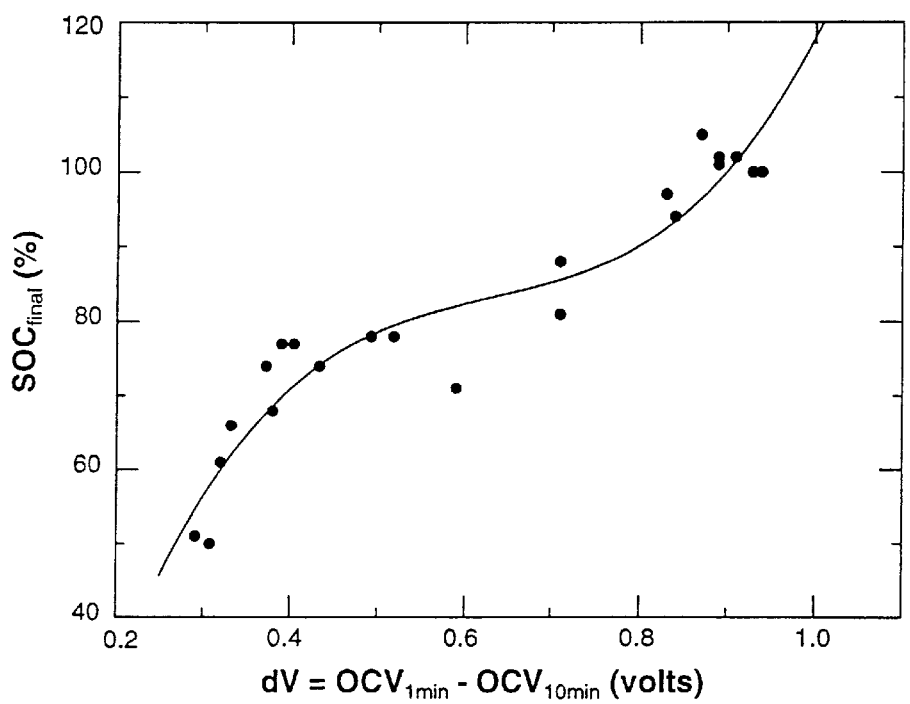
Figure 4   SOC measurement algorithm using the OCV recovery slope

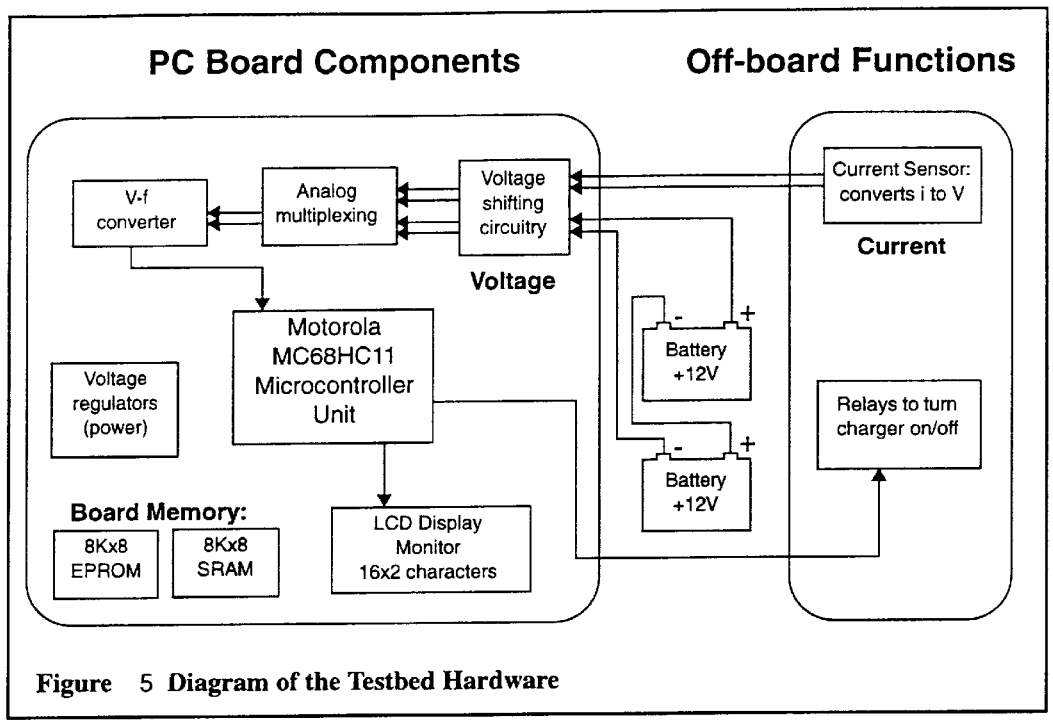
Figure 5  Diagram of the Testbed Hardware
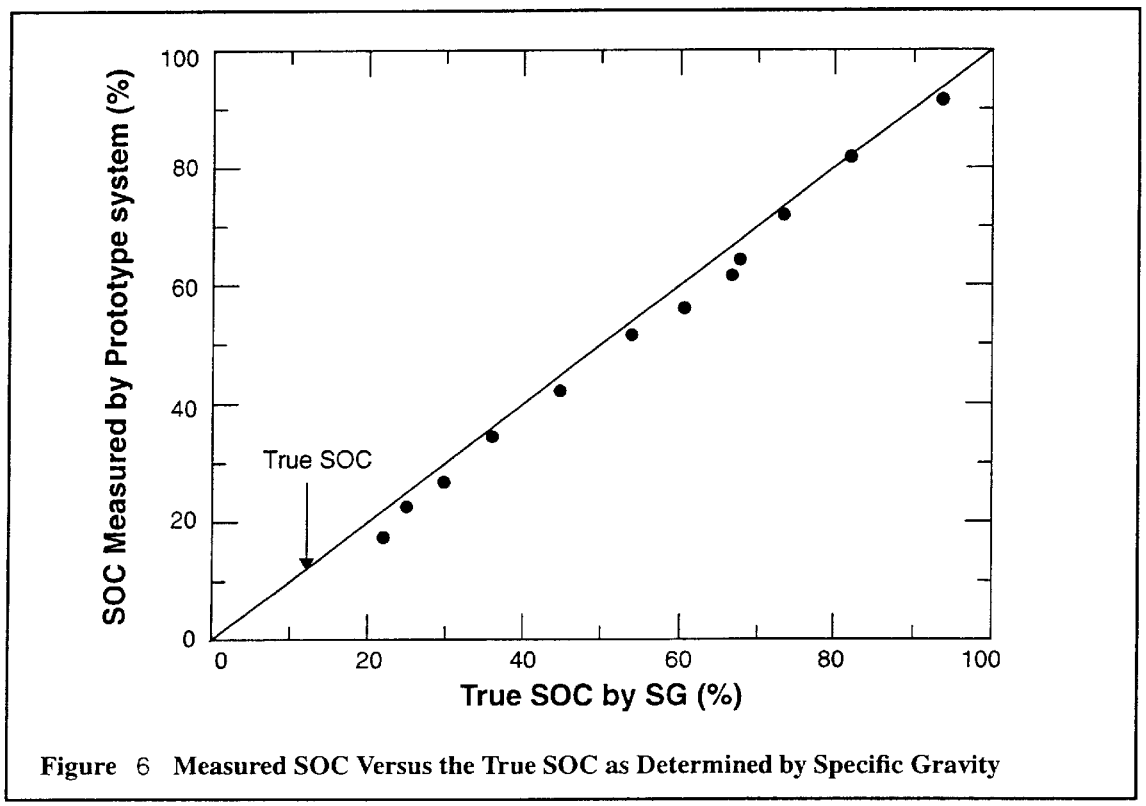
Figure 6  Measured SOC Versus the True SOC as Determined by Specific Gravity

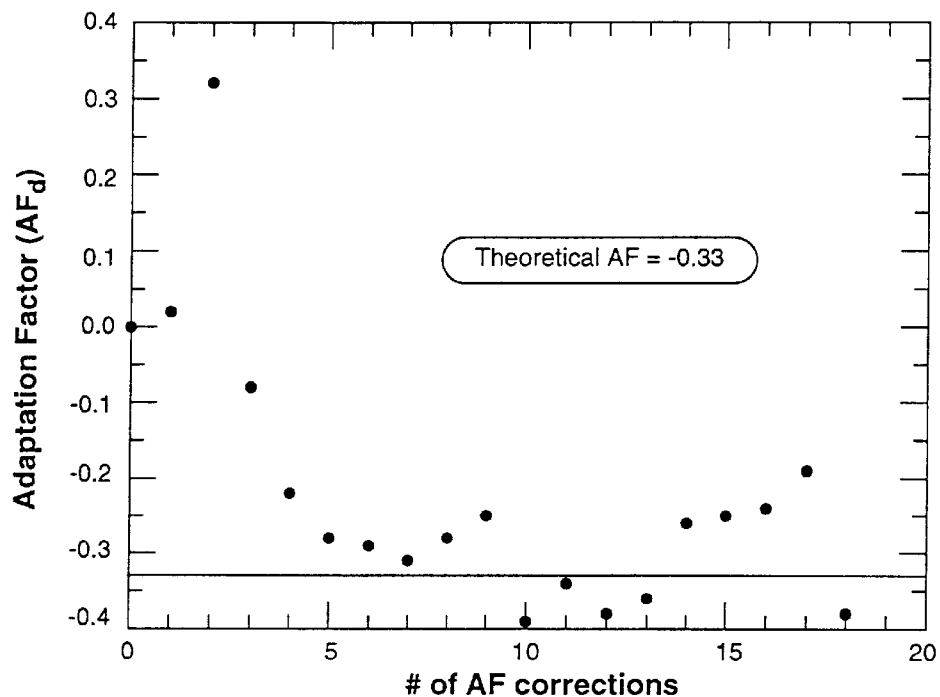
Figure 7  Progression of the Adaptation Factor as the Energy Management System Learns the Condition of the Batteries
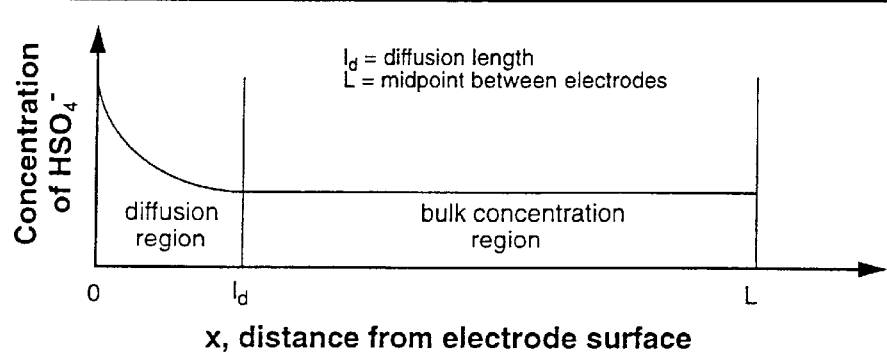
Figure 8  Concentration profile created by charging

METHOD FOR MONITORING REMAINING BATTERY CAPACITY

This is a continuation-in-part of copending application Ser. No. 60/008,246 filed on Dec. 6, 1995.

BACKGROUND OF THE INVENTION

1. Field of the Invention

The present invention relates to charging systems and battery usable capacity level monitoring, and more particularly to lead-acid batteries where the battery is a sole source of power, as for example, electric wheelchairs, electric vehicles, traction vehicles, fork-lifts, golf carts, and marine vehicles, such as sail boats.

2. Brief Description of the Prior Art

The lead-acid battery has proven itself as a successful means of storing and providing electric power for over a century. Due to its low cost and high versatility, it represents about 60% of all batteries sold worldwide, or about 10–15 million dollars in annual retail sales. With the advent of electric vehicular technology, the near term role of lead-acid batteries in contemporary society should grow even larger.

Over the last century, battery technology has experienced dramatic improvements, yet battery energy management still remains an area of characterized by uncertainty. In modern applications where the remaining capacity is crucial (such as electric wheelchairs), battery users frequently overcharge, inefficiently cycle, and prematurely replace their batteries because accurate, affordable monitoring systems do not exist. As battery systems become more complex, the penalty incurred by poor energy management increases.

The first practical lead-acid battery was invented in 1859 and demonstrated for the French Academy of Science in 1860 by the French physicist Raymond Gaston Plante. Plantes battery consisted of two long strips of lead foil, separated by intermediate of factors. Two practical metrics for determining the remaining energy which the battery can supply are the usable capacity and the state of charge (SOC).

The usable capacity of a battery is the number of ampere hours (AH) which can be obtained at a specified discharge rate before the battery voltage reaches a pre-defined cut-off voltage (generally 1.75 V for a lead-acid cell). Unfortunately, usable capacity varies significantly with discharge rate, as less usable capacity is obtained with increasing discharge rates. This dependence is commonly referred to as Peukert's effect, and is characterized in Peukert's equation. In Peukert's equation, I is the rate of discharge, T is the total discharge period, and a and 6 are constants which must be determined individually for each lead-acid battery.

$$I \cdot T = b$$

Typically, state of charge is defined with respect to the percentage of sulfuric acid in the electrolytic solution when battery is at equilibrium. Equilibrium being when the battery is under no load (open circuit), the electrolyte concentration is uniformly distributed throughout the cell, and the only activity occurring is the cell's natural self-discharge. Unfortunately, reaching equilibrium in a lead-acid battery can be a lengthy process, typically taking at least 2–4 hours after any discharging activity and as long as a week after any charging activity. This delay exists because the diffusion process which eliminates the concentration gradients in the cell's electrolyte is relatively slow. The additional delay following a charging cycle exists because the diffusion rate of sulfuric acid liberated internally in the porous electrodes is much slower than the diffusion rate in the electrolytic solution.

The SOC can be determined by either open circuit voltage or specific gravity measurements. The open circuit voltage of a lead acid cell is related to the concentration of acid at the interface between the cell's electrode and the electrolyte, and is specified by the Nernst equation set forth hereinafter as equation 2.2, where R is the universal gas constant (8.3144 J/(K*mol)), F is Faraday's constant ($9.65 \cdot 10^4$ J/(V*mol)), and T is the temperature in Kelvin.

$$E = 1.88 + \frac{2.3 \cdot (RT)}{2F} \log \frac{[Pb^{4+}] \cdot [Pb]}{[Pb^{2+}]^2} \qquad 2.2$$

The Nernst equation for a lead-acid battery can also be expressed in the form given in equation 2.3.

$$E = 1.88 + \frac{2.3 \cdot (RT)}{2F} \log \frac{[H^+] \cdot [HSO_4^-]}{[H_2O]} \qquad 2.3$$

Energy management in a lead-acid battery system is not trivial. The use of coulometric summation to monitor the usable capacity is skewed by Peukert's effect, and Peukert's effect is difficult to characterize because Peukert's constants vary among individual batteries. Measuring specific gravity with a hydrometer to determine the SOC is not only time consuming, but also hazardous due to the nature of sulfuric acid. The results produced by hydrometer measurements are also susceptible to the effect of temperature variations, and impossible in sealed or gelled-electrolyte batteries. Measuring the open circuit voltage (OCV) to determine the SOC requires a lengthy recovery period (2–4 hours after discharging, up to a week after charging), and OCV readings are also affected by the electrolyte's temperature. Other methods that have been used or suggested for monitoring the SOC or remaining capacity during discharging include measuring the battery's impedance, the series capacitance, the response of a small AC signal applied to the battery, and creating equivalent circuit models. Unfortunately, none of these methods have provided a practical foundation for monitoring battery capacity, as they are either affected by or fail to account for the effects of one or more of the following factors:

Rate of discharge

Pattern of discharge (rest period frequency and duration, cycling frequency)

Physical battery characteristics (plate grid materials, plate geometry, electrolyte concentrations) Battery environment (temperature)

Battery aging

During charging, several other techniques have been studied for monitoring the SOC including charging time, battery temperature, absolute current or voltage magnitude, derivatives (1st or 2nd) of the voltage curve for a constant or pseudo-constant current charging process, and hydrogen gas production. Once again, these methods can be affected by factors such as charging rates or patterns, previous battery use (depth of discharge, rest period duration in the discharged state), physical battery characteristics, and the battery's environment. The complexity and cost of measuring circuitry also hinder some measurement methods such as the $2^{nd}$ derivative voltage method and the hydrogen gas sensing technique.

BRIEF DESCRIPTION OF THE DRAWINGS

The advantages of the instant disclosure will become more apparent when read with the specification and the drawings, wherein:

FIG. 1 is a graph of the typical OCV recovery curve and the OCV monitoring method;

FIG. 2 is a graph illustrated the predicted equilibrium OCV vs. the actual recovery rate;

FIG. 3 is graph illustrating the charging efficiency for various charging patterns, durations and percentages of replenished charge;

FIG. 4 illustrates the SOC measurement algorithm using the OCV recovery slope;

FIG. 5 is a schematic of the testbed hardware;

FIG. 6 is a graphic depiction of measured SOC vs. the true SOC as determined by specific gravity using the prototype system;

FIG. 7 illustrates the progression of the adaptation factor as the disclosed system learns the condition of the batteries; and FIG. 8 illustrates the concentration profile created by charging.

SUMMARY OF THE INVENTION

The process of battery energy management is subject to errors to the a variety of factors, such as variation in properties between different sizes and types of batteries, variations which occur during the aging process of each battery. Moreover, the variations or deterioration which occurs during the aging process, will vary depending the rate of discharge history of the battery, the overcharging to which the battery has been subjected, as well as variations in the temperatures and agitation to which each battery has been subject.

It has now been found that a method can be employed to accurately determine the remaining capacity of a battery, by automatically adjusting for the idiosyncratic characteristics of the battery and the use history of the battery. This determination is critical for lead-acid batteries which are used to drive a land or water vehicle. It is particularly critical to users of wheel chairs and battery powered boats, since the user must avoid being stranded due to the battery having been fully discharged.

The method of the instant invention relates mosts specifically to lead-acid batteries, and uses a combination of measurements in order to produce an accurate state of charge determination and to have the determination adjust for the usage history of the battery. Basically, the process involves;

a. obtaining a coulometric summation during battery operation, with open circuit voltage measurements taken during the first few minutes of battery's recovery from use, and b. obtaining open circuit voltage measurements during an initial period of recovery of the battery.

By the procedure, compensation is provided for differences which are created by variations due to battery replacement, battery aging, steady state temperature differentials, and the decrease in usable capacity at increasing discharge rates. The coulometric summation is obtained during the charging and/or discharging of the batteries.

More specifically the method includes the steps of measuring the state of charge coulometric summation, monitoring the open circuit voltage during the battery recovery process, and adjusting for differences between the state of charge as measured by coulometric summation and measured by monitoring the open circuit voltage recovery process. In order to adjust for differences between batteries and/or changes in a specific battery, an adaptation factor is calculated, thus minimizing the error created by variations due to battery replacement, battery aging, steady state temperature differentials, and the decrease in usable capacity at increasing discharge rates.

The invention can also be viewed as the tracking with high accuracy, of a lead-acid battery's state of charge during discharging. The tracking system includes;

a. obtaining a coulometric summation during battery operation, with open circuit voltage measurements taken during the first few minutes of said battery's recovery from use, b. obtaining open circuit voltage measurements during an initial period of recovery of the battery, and c. adaptively learning said battery's size and conditions by storing historic operational data in computer memory and calculating from stored data, an adaptation factor.

The tracking system is essentially independent of variations in battery treatment during the tracking, including rest period durations and frequency, cycling frequency, discharge patterns, and battery environment including temperature variations and degree of agitation of the battery.

In an other aspect of the invention overcharging is regulated, since excessive overcharging can produce battery deterioration, but slight overcharging, preferably up to 105%, is desirable. By overcharging sufficiently to produce sufficient gassing to destratify the battery, while remaining below the level which deteriorates the battery beyond a predetermined acceptable limit, the life of the battery is optimized.

The regulation of the amount of overcharging performed while replenishing a full charge to lead-acid batteries, includes the steps of;

a. obtaining a coulometric summation during battery operation, with consecutive open circuit voltage measurements taken during the first few minutes of the battery's recovery from use, and b. obtaining open circuit voltage measurements during an initial period of recovery of the battery, and c. adaptively learning the battery's size and conditions by storing historic operational data in computer memory and calculating from stored data, an adaptation factor, thereby rendering the tracking essentially independent of variations in battery treatment during the tracking, including rest period durations and frequency, cycling frequency, discharge patterns, and battery environment including temperature variations and degree of agitation of the battery. The user can be presented with a visual display of the state of charge, remaining ampere hours, time remaining to discharge of full useful current at the current discharge rate, and/or miles remaining to discharge of full useful current, based on the discharge rate.

The discharge rate can be based on the current discharge rate, but most preferably, includes an average of prior discharge rates. It is preferable to provide a warning signal which can be a visual and/or audio signal, when the state of charge is less than a predetermined minimum level, as determined by steps (a), (b) and (c). Preferably, a warning signal is provided at the 50% level, since the user would then have the opportunity to travel roughly to the starting point. A further warning can be provided at a point nearer to full discharge, such as the 75% discharge level, that is the 25% capacity remaining level.

The coulometric summation incorporates and essentially continually measures of the battery current flow and the duration of discharge. By multiplying the current and duration of discharge, whereby the removed current capacity is obtained. The determination of the removed current capacity is adjusted inversely, relative to the measured discharge rate, in order to account for the adverse effects of high discharge rates.

The method of the invention involves obtaining consecutive open circuit voltage recovery calculations, preferably about three in number. The consecutive reading most preferably have intervals in which at least about 5% of the battery capacity has be removed, for reasons which are detailed, hereinafter.

An error factor is determined in accordance with the formula, $$EF = \frac{(SOC_{isum} - SOC_{open\ circuit\ voltage})}{(SOC_{open\ circuit\ voltageprev} - SOC_{-isum})}$$

wherein state of charge is the state of charge

EF is the error factor,

SOC is the state of charge $SOC_{isum}$ is the difference between removed capacity and the remaining capacity, $SOC_{open\ circuit\ voltage}$ is state of charge defined with respect to the percentage of sulfuric acid in the electrolytic solution when battery is under no load, $SOC_{open\ circuit\ voltageprev}$ is previous state of charge, open circuit determination.

An adaptation factor is provided which is a weighted average of the adaptation factor for contemporary operation and the adaptation factor for previous operations. Previous adaptation factors are weighted more heavily than the new adaptation factor, in accordance with the formula, $$AF_d = (x)[EF + AF_{dprev} + (EF * AF_{dprev})] + (y)[AF_{dprev}],$$

wherein $AF_d$ is adaptation factor, $AF_{dprev}$ is previously determined adaptation factor, (x) is a first fraction, (y) is a second fraction, the second fraction being larger than the first fraction, and (x)+(y)=1, whereby the true state of charge of the batteries is determined and the adaptation factor calculation enables the energy management system to learn the battery conditions including age, and/or environment, which are use pattern dependent. Preferably, x=⅓ and y=⅔. Following a charging cycle, at least about 10% of the capacity must be removed before the open circuit voltage recovery process is monitored and the open circuit voltage recovery determination is not made when the state of charge is less than about 10%. Preferably, about 20% of the capacity is removed before the open circuit voltage recovery process is monitored and the open circuit voltage recovery determination made when the state of charge is less than about 20%.

During the recovery process from a discharging cycle, the open circuit voltage is monitored for about the first seven minutes, subject to the above restrictions.

DETAILED DESCRIPTION OF THE PREFERRED EMBODIMENTS OF THE INVENTION

It has now been determined that any accurate battery energy management system must incorporate more than one method for measuring the remaining capacity, due to the large number of variables which are encountered. It has been found that the problems of the prior art systems can be overcome throughout the use of an energy management system which utilizes coulometric summation during battery operation, with open circuit voltage measurements taken during the first few minutes of the battery's recovery from use.

The invention improves on both the SOC (state of charge) monitoring process used when lead-acid batteries are being discharged, and the charge monitoring and controlling process. Examples of the advantages are that the system:

Is more accurate in tracking the battery's SOC during discharging, with a mean error of only 2.8% when tested on a wheelchair.

Is not skewed dramatically by variation in battery treatment (rest period durations and frequency, cycling frequency, discharge patterns), or battery environment (temperature, agitation).

Is adaptive, in that it can learn the size or condition of the battery.

Reduces the amount of overcharging performed while still replenishing a full charge to the batteries.

Eliminates the need to guess about a battery's SOC or to rely upon inaccurate equipment.

The system of the invention can be used as a stand-alone testing unit or can be attached to the batteries of any traction vehicle system or battery powered device. The device has a display to signal the SOC, remaining ampere hours, or the remaining time at the current discharge rate, etc. Where a system already has a microprocessor, the algorithm can be incorporated into that system's software, along with any extra hardware required, such as a means of measuring current and voltage an display or alarm circuitry. The system is accurate and contains features not found in prior art monitoring devices, and it is not affected by most factors which affect prior art capacity monitoring devices.

The difference between use of the energy management system for a wheelchair, golf cart or marine battery monitor, is the open circuit voltage range of the batteries which is handled through simple software adjustments. The adjustment is necessary because lead-acid batteries for different applications are designed with varying electrolyte densities, and thus varying operational ranges of specific gravity and OCV. The software can also be designed so that the management system displays time remaining, or amphere-hours remaining, rather than SOC. Alarms and warning breakpoints can also be included, as for example to indicate that the SOC is less than 50%. It can be critical in numerous application to know the remaining capacity of the battery, particularly when the operator is de pendent upon the battery to get to a necessary destination. This can be the case with operators of wheel-chairs or electric powered boats, who are in danger of being stranded between two locations which have recharging capabilities. The device of the present invention can be also be calibrated to provide a readout in time to empty or miles to empty.

The disclosure of the energy management system is divided into three sections. First, the development of the energy management algorithms; second, the details of the energy management algorithms are then disclosed and finally, the hardware developed prototype which was tested on an electric wheelchair.

The energy management system is based on coulometric summation (adding or subtracting capacity as calculated by current and time), during charging or discharging of the batteries, and open circuit voltage (OCV) measurements during the first few minutes of recovery from use.

When a battery is being discharged, the energy management system uses coulometric summation to monitor the battery's SOC. Coulometric summation means that the current and the duration of discharge are continually measured and multiplied to obtain the removed capacity. Unfortunately, the capacity of a battery is dependent on the discharge rate, so a second measurement technique needs to be implemented to correct the error created by Peukert's effect.

The second technique used by the system is to monitor the first few minutes of the OCV recovery process following any discharging activity. This concept, along with a prototype adaptive battery monitor, was introduced in 1993 when it was shown that if time was plotted on a logarithmic scale, the first few minutes of OCV recovery were linear. It was determined that this linearity could be used to predict the equilibrium OCV of a lead-acid battery. This discovery was important, because if the equilibrium OCV was known (or predicted), the SOC could be determined. This prediction method is illustrated in FIG. 1, where $V_{rec}$ is the recovered, or equilibrium OCV.

This equilibrium OCV prediction technique uses coulometric summation to calculate the removed capacity during discharging, as shown in equation 3.1

$$\text{Capacity}_{removed} = i_{removed} \cdot \text{time} \cdot (1 + AF_d) \qquad 3.1$$

The correction factor (presently renamed the adaptation factor and shown as $AF_d$ in equation 3.1), accounts for differences between the SOC as measured by coulometric summation and the SOC as measured by monitoring the OCV recovery process. These differences can be created by many factors, such as variations in battery size (aging), steady state temperature differentials (cold climates), or Peukert's effect (batteries have less usable capacity at higher discharge rates).

The accuracy of this OCV prediction technique is shown in FIG. 2, where voltage recovery data is plotted next to the predicted equilibrium voltage at four different states of charge. The major factor which affects this OCV recovery algorithm is the residual overvoltage created by the charging process. To eliminate the effect of overvoltages, prevent small errors in OCV measurements from creating falsely large adaptation factors, as well as prevent the possibility of the prediction algorithm being used when a battery has reached the knee of its discharging curve, the following four restrictions were placed on the use of the OCV recovery algorithm:

1) At least 5% of the battery capacity must be removed between consecutive OCV recovery calculations.
2) The adaptation factor (AF) is desensitized. AF is calculated by taking a weighted average of the present AF and the previous AF where the previous AF is weighted twice as heavily as the new AF.
3) Following a charging cycle, at least 20% of the capacity must be removed before the OCV recovery process is monitored.
4) The OCV recovery algorithm is not performed when the SOC is less than 20%.

During discharge, the energy management system uses coulometric summation to determine the SOC. During the recovery process from a discharging cycle, the OCV is monitored for about the first 6.6 minutes, subject to the above four restrictions. This voltage recovery process is used to predict the true SOC of the batteries and to calculate an adaptation factor which allows the energy management system to learn the condition (age), environment, or use pattern of the batteries.

During the charging process, coulometric summation by itself is not a reliable method of monitoring the SOC, due to the variation in battery charging efficiency. Charging efficiency refers to the ratio of energy accepted by the battery as stored energy to the energy supplied by the battery charger, as shown in equation 3.2.

$$\text{Efficiency}_{charging} = \frac{\text{Ampere\_hours\_stored\_in\_battery}}{\text{Ampere\_hours\_supplied\_by\_charger}} \qquad 3.2$$

Generally, the efficiency of the charging process is stated to be somewhere between 0.70 and 0.85. To verify these numbers, as shown in FIG. 3, the charging efficiency was monitored for many different charging patterns, charging durations, and percentages of replenished charge. Additionally, the batteries were rested for varying times at various states of discharge. If the slope of this line is taken by a simple linear regression, the charging efficiency is determined to be 0.74. This result is certainly consistent with charging 'rules of thumb'. However, each individual data point did not always conform exactly to this rule, as the variation in charging efficiencies varied between 0.53 and 1.0. Thus, during charging, coulometric summation needs to be coupled with another technique, such as the OCV recovery process.

Research on the OCV recovery process has shown a strong correlation between the battery's SOC and the slope of the OCV recovery curve over the first ten minutes following the termination of charging activity. The results of this research, graphed in FIG. 4, show that the OCV drop over the first ten minutes of recovery from charging can be used to determine the battery's SOC, as given by equation 3.3.

$$SOC = 495 \, (dV)^3 - 937 \, (dV)^2 + 618 \, (dV) - 58 \qquad 3.3$$

In order to consider all techniques, two new aspects of a typical loaded voltage discharge curve were examined to judge the SOC information content. The two characteristics were the duration of time needed to reach the constant slope region of the discharge curve and the actual slope itself. Unfortunately, neither of these methods were successful. The time to reach the constant slope region of the curve appeared to be more dependent on factors such as the previous battery use and the prior rest period duration rather than just the initial SOC. The slope of the discharge curve did vary with respect to the SOC of the batteries, but the slope was much more dependent upon the discharge rate than any other factor.

Another method investigated involved the application of predetermined discharge and charge 'test' cycles to the batteries, and monitoring the OCV recovery from these cycles. The hypothesis of this method was that the extrapolation of the OCV recovery lines from the charging and discharging activity would intersect at the true SOC of the batteries. Additionally, the application of a predetermined discharging and charging 'test' cycle eliminated numerous variables, including rate of discharge/charge, time of discharge/charge, and the rest time between discharging and charging. Unfortunately, when the previous use of the batteries was a charge, this method was quite skewed by the concentration overvoltages created during the charging cycle. Thus, the application of predetermined discharge and charge 'test' cycles did not yield any advantage over the previously discussed OCV recovery method.

During discharging, when a lead-acid battery is under load (discharging), the energy management system continually monitors the current. When the system is first initialized, it assumes a certain value for the battery's usable capacity (in ampere-hours), and an adaptation factor of 0. While the battery is discharging, the current measurements are used to calculate the removed capacity, according to equation 3.4.

$$\text{Capacity}_{removed} = i_{removed} \cdot \text{time} \cdot (1 + AF_d) \qquad 3.4$$

This removed capacity is then subtracted from the remaining capacity, which is used to calculate the battery's SOC according to equation 3.5. This SOC measurement is termed $SOC_{isum}$ since the algorithm used is coulometric summation.

$$SOC_{isum} = \frac{\text{Capacity}_{remaining}}{\text{Capacity}_{rated}} \cdot 100 \qquad 3.5$$

During rest periods that meet the following three requirements, the OCV is monitored. The three requirements are:

1) Greater than 20% of the capacity has been removed since previous discharging activity.
2) Greater than 5% of the capacity has been removed since the previous adaptation factor (AF) calculation (since the last time the OCV recovery was monitored).
3) The SOC is greater than 20%.

If all three conditions are met, the OCV is monitored for about the first 6.6 minutes of recovery from discharging. At both 1 minute and 6.6 minutes of rest time, three consecutive OCV readings are taken (each measurement takes 0.2844 seconds) and averaged. The equilibrium OCV is calculated according to equation 3.6

$$OCV_{equilibrium} = 2 \cdot OCV_{6.6min} - OCV_{1min} \qquad 3.6$$

From the equilibrium OCV, the state of charge (SOC) is calculated, according to equation 3.7, $$SOC_{OCV} = \frac{(OCV_{equilibrium} - 23.4)}{2.0} \cdot 100 \qquad 3.7$$

This SOC, as measured by OCV, is taken as the true SOC of the batteries, and is used in conjunction with the coulometric equation 3.8. In this equation, $SOC_{OCVprev}$ represents the SOC as ally determined SOC to determine the error factor, as shown in determined by OCV during the previous rest period.

$$EF = \frac{(SOC_{isum} - SOC_{OCV})}{(SOC_{OCVprev} - SOC_{isum})} \qquad 3.8$$

Finally, this error factor is used to calculate the new adaptation factor. The new adaptation factor is desensitized by taking a weighted average with the previously determined adaptation factor, $AF_{dprev}$ as shown in equation 3.9.

$$AF_d = \frac{1}{3} [EF + AF_{dprev} + (EF \cdot AF_{dprev})] + \frac{2}{3} [AF_{dprev}] \qquad 3.9$$

When discharging activity resumes, this desensitized adaptation factor, $AF_d$, is used to adjust the removed capacity, as previously shown in equation 3.4. As long as the discharging process continues, the energy management system continues to monitor current when the battery is under load, and OCV when rest periods that meet the three criteria occur.

When the batteries are being charged, the energy management system uses coulometric summation to calculate the amount of capacity replenished to the battery, as shown in equation 3.10. Included in this calculation is a charging efficiency factor, $C_{eff}$, which is the average efficiency for constant-current and pseudo-constant current charging cycles, and was determined to be 0.74.

$$\text{Capacity}_{replenished} = i_{replenished} \cdot \text{time} \cdot C_{eff}(1 + AF_d) \qquad 3.10$$

This replenished capacity is then added to the remaining capacity, which is used to calculate the SOC in the same manner as previously shown in equation 3.5.

When the SOC, as monitored by coulometric summation, reaches 80%, the energy management system opens the charging relay, which turns off the charger. The OCV recovery process is then monitored. At rest times of 1 and 10 minutes, three consecutive OCV measurements are taken and averaged. The OCV recovery slope is then calculated as shown in equation 3.11.

$$dV = OCV_{1minute} - OCV_{10minutes} \qquad 3.11$$

This OCV recovery slope is then inserted into equation 3.12 to determine the state of charge, $SOC_{OCV}$ $$SOC_{OCV} = 495 (dV)^3 - 937 (dV)^2 + 618 (dV) - 58 \qquad 3.12$$

The SOC as determined by OCV, ($SOC_{OCV}$) is then averaged with the coulometrically determined SOC, ($SOC_{isum}$, which should be 80%), to determine the best estimate SOC, as shown in equation 3.13.

$$SOC = \frac{SOC_{OCV} + SOC_{isum}}{2.0} \qquad 3.13$$

Once the best estimate SOC has been determined, the energy management system closes the charging relay and resumes the charging process. $SOC_{isum}$ is set equal to the best estimate SOC, and the OCV correction algorithm is repeated when $SOC_{isum}$ reaches 90% and 100%. After the final correction, the batteries are charged up to $SOC_{isum}$= 105%. This slight overcharging equalizes the charge among the cells, and allows a small amount of gassing to destratify the battery.

There is one stipulation on the OCV corrections during the charging recovery process. If less than 5% of the capacity has been replenished since the previous OCV correction, the OCV recovery process is not monitored, and battery charging resumes. For example, in the following scenario:

1) The SOC reaches 80%. ($SOC_{isum}$=80%)
2) The OCV is monitored, and $SOC_{OCV}$ is determined to be 92%.
3) The best estimate SOC is the average of $SOC_{OSV}$ and $SOC_{isum}$ which is 86%.
4) When charging is resumed and $SOC_{isum}$ reaches 90%, no OCV measurements will be performed, because 5% of the capacity has not been replenished since the previous OCV correction (when $SOC_{isum}$ was set equal to 86%). The charging process will continue until $SOC_{isum}$ reaches 100%, at which point the charging relay will be opened and the OCV recovery process will be monitored.

The energy management algorithm during the charging process can be summarized as follows:

1) Current is monitored while the batteries are being charged.

2) The charging process is stopped at SOC=80%, 90%, and 100% so that the OCV recovery process can be monitored.

3) OCV measurements are averaged with the current measurements to obtain the best estimate SOC, 4) The charging process is terminated when $SOC_{isum}$, reaches 105% (a slight overcharge).

The energy management algorithms disclosed herein are applicable to any traction vehicle type-application powered by lead-acid batteries. However, since the original research was conducted for the powered wheelchair application, the prototype used for experimentation was designed for a dual battery, 24 V system.

To monitor the battery capacity, the energy management system needs to have the following capabilities:

Voltage measurement

Current measurement

Data processing—calculation of capacity based on voltage, current, and temperature data Memory—storage space for algorithms and data (capacity, correction factors, etc.,)

Data display

The following additional qualities are desired for the system:

Low power consumption

Low cost

Simplicity and flexibility in design

A block diagram of the hardware components and their interconnections is shown in FIG. 5. The diagram reflects the actual setup, as the commercially purchased current sensor and the charging control relays do not physically reside on the test bed PC board.

The voltage measuring process consists of five stages:

1) Voltage shifting—transforming 21–29 V to a common range, 0–5 V
2) Voltage clipping—not allowing any voltage higher than 5 V to be passed to the analog multiplexor
3) Analog multiplexing—selecting to measure voltage
4) Voltage to frequency conversion—transforming 0–5 V to a frequency, 0–14.4 KHz
5) Pulse accumulation—counting the number of pulses received in a known period (0.2844 seconds)

Voltage shifting and clipping are accomplished by standard op-amp shifting and clipping circuitry, using an LM324 quad op-amp package. Analog multiplexing selects whether voltage measurements or current measurements are passed to the microcontroller, and is provided by a CD4053BCN. Voltage to frequency conversion is accomplished with an LM331 V-f converter, which produces a frequency between 0 and 14.4 KHz depending upon the voltage input (0–5 V). The voltage to frequency converter was selected as opposed to an analog to digital converter, because the measurement speed was not critical and the V-f converter provided 12-bit accuracy at a cost savings of about fifty dollars. Finally, the pulse accumulator of the MC68HC11 microcontroller counts the number of rising pulse edges in a known period (0.2844 seconds) to determine the battery voltage. The constant measurement period of 0.2844 seconds is provided by a microcontroller interrupt which triggers upon the overflow of its internal 16 bit counter. This voltage measurement system measures the voltage range of 21–29 V with 12 bit accuracy (000-FFF Hex).

The current measuring process also consists of five stages:

1) Conversion of current to voltage—the current sensor transforms the battery current to a voltage
2) Voltage shifting—transforming the voltage output of the current sensor to a common voltage range, 0–5 v
3) Analog multiplexing—selecting the current measuring channel
4) Voltage to frequency conversion—transforming 0–5 V to a frequency, 0–14.4 KHz
5) Pulse accumulation—counting the pulses over a known period (0.2844 seconds) to determine the frequency The conversion of current to voltage is provided by a commercially produced current sensor, (Microswitch CSLB1AD), which measures current ranging from −57 A to +57 A. This device provides an output of 3 V for −57 A, 6 V for 0 A, 9V for 57A, and a linear relationship between these points. The shifting circuitry transforms this 3–9 V range to 0–5 V, and the remainder of the circuitry is the same as what is used for voltage measurement, less the clipping circuit. Twelve bit precision for current data is needed to obtain sufficient precision around zero amps, in order to ensure that open circuit voltage readings are only taken when the battery is truly at rest.

The dominate advantage of the disclosed system is its ability to take voltage and current data, and produce an accurate capacity reading for the user. The Motorola 68HC11AO microcontroller was chosen as the CPU for the system due to its low cost, its features (pulse accumulator, on board A/D converter, large number of IO ports), and its ease of use. The system required memory for two purposes, program storage and data storage. An 8K EPROM (the 27C64) was chosen to accommodate the program storage requirements, and an 8K external static RAM chip (the SRM22C64) was used for data storage (the stack, temporary variable storage, etc.). The final program used about 6K of ROM and about 512 bytes of RAM, so these memory device selections were adequate.

A 16×2 character LCD display unit was used, which allowed for a large amount of information (current, voltage, time, temperature, etc.) to be displayed concurrently. This display unit also proved to be extremely useful during both the debugging stage of the testbed's hardware, and the development of the capacity monitoring software.

Actual testing of the energy management system on a lead-acid battery powered electric vehicle was considered crucial for several reasons. In a real-life application such as an electric vehicle the discharge rate is not constant. The load placed upon the batteries varies according to the slope of the surface (incline or decline), the surface construction material (asphalt, gravel, or grass), and the condition of the surface (wet or dry, smooth or rough). Finally, in a vehicle such as a forklift or a powered wheelchair, the discharges will generally be frequently interrupted with intermittent stopping periods due to traffic, etc. The energy management system was tested on an Everest and Jennings "Custom premier" wheelchair. The wheelchair operated on 24 V which was provided by two 12V, 22NF "deep discharge" wheelchair batteries, with an original rated capacity of 40AH at the 5 A discharge rate. Although the exact history of the batteries was unknown, since they had been in the chair for several months, it is estimated that they had been cycled 100 times or more.

The testing procedure was conducted over several routes, surfaces, and conditions. The grade of the wheelchair's route varied from level surfaces to inclines and declines of up to 20 degrees. The surfaces included asphalt street, gravel streets, packed dirt streets, packed sand walkways, concrete sidewalks, brick sidewalks, and grass. Tests were conducted on both wet and dry surfaces, and both smooth and bumpy, cracked surfaces.

The test results are displayed in FIG. 6, where specific gravity is used as an indicator of the true SOC. As shown, the system performed quite accurately, with the mean error equal to 2.8%, the largest error being 5.0%, and the smallest error being 0.3%. In order to ensure that the specific gravity measurements were accurate, the batteries were allowed to rest for a duration ranging from 2 to 14 hours following discharging activity. The hydrometer used was calibrated for temperature, although temperature was likely not a factor as the rest periods were all conducted indoors, in a fairly constant temperature room. The hydrometer, a NAPA Balkamp 700–1145, was calibrated against two other hydrometers, (a NAPA Balkamp, 700–1146 and an EZ-Red spin float hydrometer), and the specific gravity readings were compared to stabilized OCV measurements to ensure accuracy.

For the wheelchair testing, the energy management system was programmed with an initial capacity of 30AH. If the batteries on the wheelchair had been new (40AH), then the adaptation factor should have converged to –0.33 after several corrections. If the batteries were slightly aged, then the theoretical value for the adaptation factor should have been slightly greater, perhaps 0.30. The value of the adaptation factor at each correction is shown in FIG. 7, with the $AF_d$ converging towards a value near –0.33 or –0.30. The oscillation of the adaptation factor about this value was caused by residual concentration overvoltages which skewed the first correction after each charging cycle. However, the error between the $SOC_{isum}$ and $SOC_{OCV}$ created by these overvoltages was generally less than 10%, and occurred at a time when the SOC was not at a critically low point.

The results of several charging cycles are shown in Table 1, along with a comparison of the energy management system's charging process to a leading commercial wheelchair battery charger. The commercial charger was the Lostronics II, made by Lester Electrical of Lincoln, Nebraska. It automatically terminates the charging process by monitoring the slope of the voltage curve during charging. More specifically, when the charging voltage ceases to rise more than a certain number of millivolts in a thirty minute period, it shuts off the charging current.

TABLE I

| Charge Cycle | Charging Time (hrs) | Final SOC (%) by SG |
|---|---|---|
| 1 | 7.0 | 101 |
| 2 | 8.0 | 102 |
| 3 | 9.0 | 105 |
| 4 | 8.5 | 100 |
| Prototype Av. | 8.1 | 101.8 |
| Lestronics Av. | 11.4 | 103.6 |

Table 4-1 shows the average charging times and final states-of-charge reached during four separate charge cycles using the energy management prototype. The average data from these four trials is then compared with the average data from eight charge trials using the Lestronics II commercial charger. For all charging cycles, the SOC at the initiation of charging was between 20–35%. As shown by the data, the prototype's charge termination algorithm detected the end of charge state of the battery over three hours before the Lestronics technique, yet both methods restored a full charge to the battery. This indicates that the Lestronics II was performing unnecessary overcharging, which is detrimental to the longevity of the batteries.

The disclosed energy management system accounts for variations which affect most capacity monitoring algorithms. These variations are due to concentration overvoltages created by the charging cycle, physical battery discrepancies, and variations in battery treatment.

During the charging cycle, sulfuric acid is liberated throughout both electrodes, which are porous structures similar to a sponge. The sulfuric acid molecules which are not created on the geometrical outer surface of the electrode take a long time to diffuse out of the electrode and into the bulk of the electrolytic solution. This excess acid concentration which exists at the electrode-electrolyte interface, as shown in FIG. 8, keeps the voltage of the battery at an artificially high value for a long time (up to a week) after charging. This artificially high voltage is referred to as the concentration overvoltage. Discharging the battery eliminates the excess concentration of sulfuric acid at the electrode/electrolyte interface, and thus eliminates the concentration overvoltage. For this reason, the OCV is never monitored during discharging until the battery has had at least 20% of the capacity removed since the previous charging activity.

Empirical data indicates that the diffusion process following discharging is independent of the physical battery structure. Original research acquired data on gelled-electrolyte batteries, maintenance-free sealed liquid electrolyte batteries, and regular liquid electrolyte batteries. Additional research tested both tubular and flat plate battery designs. Despite these physical variations, the OCV recovery process appeared quite similar.

The most significant physical battery variation which affects the energy management system is the composition of the electrolyte, which varies depending on the battery's application and designated thermal environment. Table II compares specific gravity readings at various states of charge for different lead acid batteries based upon their application.

TABLE II

| State of Charge | Specific Gravity | | | |
|---|---|---|---|---|
| | EV | Traction | SLI | Stationary |
| 100% | 1.330 | 1.280 | 1.265 | 1.225 |
| 75% | 1.300 | 1.250 | 1.225 | 1.185 |
| 50% | 1.270 | 1.220 | 1.190 | 1.150 |
| 25% | 1.240 | 1.190 | 1.155 | 1.115 |
| 0% | 1.210 | 1.160 | 1.120 | 1.080 |

With respect to thermal design, an automotive battery designed for use in tropical climates will have a specific gravity near 1.225 at full charge. The same battery, designed for use in cold or temperate climates, will have a specific gravity of 1.265 at full charge. In order to account for these variations, the energy management system must be initially aware of the battery's application and thermal design, and be programmed with the proper operational range of OCV versus SOC.

Since most capacity monitoring systems are severely affected by variations in battery use, such as varying discharging or charging rates and varying discharging or charging patterns, the system uses two different capacity calculation techniques (current and OCV recovery), and an adaptation factor to minimize the error created by these variations. Perhaps the greatest advantage of the energy management system is that it accounts for battery aging. As a battery gets older, its usable capacity does not fall off in a cliff-like manner, but instead tends to slowly decrease. This gradual change occurs as the plates slowly deteriorate, causing shedding and spalling, and less of the lead sulfate created by discharging is reconverted back to lead dioxide and lead during the charging process. As the battery's capacity slowly decreases, the adaptation factor will slowly increase. The energy management system will respond to battery aging in the same manner as it responds to the replacement of a battery with a smaller capacity battery. In both cases, the adaptation factor allows the system to "learn" the size and age of the battery.

Compared with other commercial capacity monitoring devices, the disclosed energy management system is unique. By coupling the information garnered from two different measurement methods (voltage and current), the error in SOC calculations is reduced. Additionally, by monitoring current with an intelligent correction factor, (the adaptation factor, $AF_d$), the system provides a continual reading of SOC, even when the battery undergoes partial discharges and recharges. Most importantly, through the use of the adaptation factor, the energy management system can "learn" the size or age of a battery, which means that no reprogramming is needed when a user replaces an system's battery. These claims are supported by extensive testing in the laboratory and on an electric wheelchair, as this system successfully adjusted to batteries which were both smaller and larger than the capacity value initially programmed.

Since other modifications and changes varied to fit particular operating requirements and environments will be apparent to those skilled in the art, the invention is not considered limited to the example chosen for the purposes of disclosure, and covers all changes and modifications which do not constitute departures from the true spirit and scope of this invention.

What is claimed is:

1. The method of producing a predetermined amount of overcharging performed while replenishing a full charge to lead-acid batteries, comprising the steps of:
   a. obtaining a coulometric summation during battery operation, with open circuit voltage measurements taken during the first few minutes of said battery's recovery from use, and
   b. obtaining open circuit voltage measurements during an initial period of recovery of the battery, and
   c. adaptively learning said battery's size and conditions, for tracking by storing historic operational data in computer memory and calculating from stored data, an adaptation factor, thereby rendering said tracking essentially independent of variations in battery treatment during said tracking, including rest period durations and frequency, cycling frequency, discharge patterns, and battery environment including temperature variations and degree of agitation of said battery,
   d. visually displaying at least one of the state of charge, remaining ampere hours, time remaining to discharge of full useful current at the current discharge rate, miles remaining to discharge of full useful current, based on the discharge rate,
   e. providing a warning signal which is at least one of visual or audio signal, when the state of charge is less than a predetermined minimum level, as determined by steps (a), (b) and (c), whereby said overcharging is sufficient to produce sufficient gassing to destratify the battery, but below the level which deteriorates the battery beyond a predetermined acceptable limit.

2. The method of claim 1, wherein said discharge rate of step (d) is the current discharge rate.

3. The method of claim 1, wherein said discharge rate of step (d) includes an average of the prior discharge rate.

4. The method of claim 1, wherein said coulometric summation comprises essentially continual measurement of the battery current flow and the duration of discharge and the multiplying of said current and duration of discharge, whereby the removed current capacity is obtained.

5. The method of claim 4, wherein the determination of the removed current capacity is adjusted inversely, relative to the measured discharge rate.

6. The method of claim 5, further comprising obtaining consecutive open circuit voltage recovery calculations, said consecutive reading having intervals in which at least about 5% of the battery capacity has be removed, determining an error factor in accordance with the formula, $$EF = \frac{(SOC_{isum} - SOC_{ocv})}{(SOC_{ocvprev} - SOC_{isum})}$$

wherein state of charge is the state of charge

EF is the error factor,

SOC is the state of charge, ocv is the open circuit voltage, $SOC_{isum}$ is the difference between removed capacity and the remaining capacity, $SOC_{ocv}$ is state of charge defined with respect to the percentage of sulfuric acid in the electrolytic solution when battery is at is under no load, $SOC_{ocvprev}$ is previous state of charge, open circuit determination.

7. The method of claim 6, wherein said adaptation factor is a weighted average of the adaptation factor for contemporary operation and the adaptation factor for previous operations, where the previous adaptation factor is weighted more heavily than the new adaptation factor, in accordance with the formula, $$AF_d = (x)[EF + AF_{dprev} + (EF * AF_{dprev})] + (y)[AF_{dprev}],$$

wherein $AF_d$ is adaptation factor, $AF_{dprev}$ is previously determined adaptation factor, (x) is a first fraction, (y) is a second fraction, said second fraction being larger than said first fraction, and (x)+(y)=1, whereby the true state of charge of the batteries is determined and the adaptation factor calculation enables the energy management system to learn the battery conditions including age, and/or environment, which are use pattern dependent.

8. The method of claim 7, wherein following a charging cycle, at least about 10% of the capacity must be removed before the open circuit voltage recovery process is monitored and the open circuit voltage recovery determination is not made when the state of charge is less than about 10%.

9. The method of claim 8, wherein following a charging cycle, at least about 20% of the capacity must be removed before the open circuit voltage recovery process is monitored and the open circuit voltage recovery determination is not made when the state of charge is less than about 20%.

10. The method of claim 7, wherein 2(x) is about equal to (y).

11. The method of claim 1, wherein during the recovery process from a discharging cycle, the open circuit voltage is monitored for about the first seven minutes.

12. The method of claim 9, wherein during the recovery process from a discharging cycle, the open circuit voltage is monitored for about the first seven minutes.

13. The method of claim 1, wherein the open circuit voltage is monitored during rest periods provided that:
   1) greater than 20% of the capacity has been removed since previous discharging activity,
   2) greater than 5% of the capacity has been removed since since the last time the open circuit voltage recovery was monitored, and
   3) the state of charge is greater than 20%.

14. The method of claim 1, wherein when the state of charge, as monitored by coulometric summation, reaches 80%, charging is terminated, and the open current voltage recovery process is monitored at predetermined rest time interval, and a plurality of consecutive open circuit voltage measurements are taken and averaged, the open circuit voltage recovery slope is calculated, and the state of charge is determined based on said averaged measurements.

15. The method of tracking with high accuracy, a lead-acid battery's state of charge during discharging, comprising the steps of:
   a. obtaining a coulometric summation during battery operation, with open circuit voltage measurements taken during the first few minutes of said battery's recovery from use, and
   b. obtaining open circuit voltage measurements during an initial period of recovery of the battery, and
   c. adaptively learning said battery's size and conditions by storing historic operational data in computer memory and calculating from stored data, an adaptation factor,
whereby said tracking is essentially independent of variations in battery treatment during said tracking, including rest period durations and frequency, cycling frequency, discharge patterns, and battery environment including temperature variations and degree of agitation of said battery.

16. A process of battery energy management utilizing a plurality of methods for monitoring the state of charge of a battery, comprising the steps of:
   a. obtaining a coulometric summation during battery operation by continually measuring said battery's current flow and the duration of discharge;
   b. accessing, for a predetermined time period, the open circuit voltage following discharge,
   c. storing said coulometric summation and said open circuit voltage reading in a data processor,
   d. calculating the current state of charge of said battery by applying a preprogrammed formula to said accessed data;
   e. providing compensation for differences which are created by variations due to battery replacement, battery aging, steady state temperature differentials and the decrease in usable capacity at increasing discharge rates;
thereby providing an accurate state of charge of said battery.

17. The process of claim 16, wherein said battery is a lead-acid battery.

18. The process of claim 17, wherein said open circuit voltage reading is obtained during the charging of said battery.

19. The process of claim 18, wherein the accuracy of said open circuit voltage reading is further increased by:
   a. determining at least 5% of the battery capacity has been removed between consecutive readings;
   b. determining an adaptation factor by taking an average of the current adaptation factor and the previous adaptation factor, weighing said previously adaptation factor twice as heavily as said current adaptation factor;
   c. removing at least 20% of the capacity of said battery;
   d. reading the open circuit voltage only after removal of said 20% of said capacity;
whereby said accuracy is increased by eliminating the effects of overvoltages, small errors in open circuit voltage readings and reading said open circuit voltage when said battery has discharge substantially above said 20%.

20. The process of claim 19, wherein said adjusting for differences comprises the step of calculating an adaptation factor to minimize the error created by variations due to battery replacement, battery aging, steady state temperature differentials, and the decrease in usable capacity at increasing discharge rates.

21. The process of claim 16 wherein said preprogrammed formula uses a first algorithm if said battery is charging and a second algorithm is said battery is discharging.

22. The process of claim 20 wherein said adaptation factor is calculated during quiescent voltage measuring cycles.

23. The process of monitoring the remaining capacity of a battery, said monitoring incorporating coulometric summation during operation of said battery, said summation requiring the steps of:
   a. continually monitoring the current of the battery;
   b. detecting a zero current;
   c. waiting a predetermined time from said zero current;
   d. taking a first voltage measurement after said predetermined time;
   e. waiting an additional predetermined time;
   f. taking a second voltage measurement after said additional predetermined time;
   g. predicting the final recovered voltage using a predetermined formula
   h. relating said predicted final recovered voltage to the remaining capacity
whereby compensation is provided for differences which are created by variations due to battery replacement, battery aging, steady state temperature differentials, and the decrease in usable capacity at increasing discharge rates.

* * * * *